United States Patent
Michigami

(10) Patent No.: US 9,647,634 B2
(45) Date of Patent: May 9, 2017

(54) ELASTIC WAVE FILTER DEVICE AND DUPLEXER COMPRISING MAGNETICALLY COUPLED INDUCTANCES

(71) Applicant: Murata Manufacturing Co., Ltd., Nagaokakyo-shi, Kyoto-fu (JP)

(72) Inventor: Akira Michigami, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 98 days.

(21) Appl. No.: 14/656,805

(22) Filed: Mar. 13, 2015

(65) Prior Publication Data
US 2015/0188512 A1 Jul. 2, 2015

Related U.S. Application Data

(63) Continuation of application No. PCT/JP2013/065834, filed on Jun. 7, 2013.

(30) Foreign Application Priority Data

Sep. 25, 2012 (JP) ................................ 2012-210935

(51) Int. Cl.
*H03H 9/72* (2006.01)
*H03H 9/64* (2006.01)
(Continued)

(52) U.S. Cl.
CPC .......... *H03H 9/0576* (2013.01); *H03H 9/059* (2013.01); *H03H 9/0557* (2013.01);
(Continued)

(58) Field of Classification Search
CPC .. H03H 9/0514; H03H 9/0557; H03H 9/0566; H03H 9/0571; H03H 9/0576;
(Continued)

(56) References Cited

U.S. PATENT DOCUMENTS 7,808,935 B2* 10/2010 Koga ...................... H01P 1/213
333/132
7,978,019 B2* 7/2011 Wiesbauer .............. H01P 1/213
333/12
(Continued)

FOREIGN PATENT DOCUMENTS

EP 2 141 805 A2 1/2010
JP 2004-173245 A 6/2004
(Continued)

OTHER PUBLICATIONS

K. Wang et al.: "A UMTS-900 Duplexer", 2008 IEEE International Ultrasonics Symposium Proceedings, Nov. 2-5, 2008, pp. 899-902, and 1 page IEEE Xplore Abstract.*
(Continued)

*Primary Examiner* — Barbara Summons
(74) *Attorney, Agent, or Firm* — Keating & Bennett, LLP

(57) ABSTRACT

In an elastic wave filter device, a package substrate is provided with an elastic wave filter chip defining a ladder circuit including a plurality of series arm resonators and a plurality of parallel arm resonators, and a first inductance connected in parallel with at least one of the series arm resonators and a second inductance connected between at least one of the parallel arm resonators and a ground potential. The first inductance and the second inductance provided in the package substrate, and the first inductance is magnetically coupled to the second inductance to shift a frequency position of an attenuation pole.

18 Claims, 5 Drawing Sheets

(51) Int. Cl.
*H03H 9/05* (2006.01)
*H03H 9/205* (2006.01)
*H03H 9/25* (2006.01)

(52) U.S. Cl.
CPC .............. *H03H 9/205* (2013.01); *H03H 9/25* (2013.01); *H03H 9/6483* (2013.01)

(58) Field of Classification Search
CPC .......... H03H 9/059; H03H 9/205; H03H 9/25; H03H 9/542; H03H 9/605; H03H 9/6483; H03H 9/706; H03H 9/725
USPC ......................................... 333/133, 193, 195
See application file for complete search history.

(56) References Cited

U.S. PATENT DOCUMENTS

| | | | |
|---|---|---|---|
| 8,138,854 B2* | 3/2012 | Hara | H03H 9/0028 333/126 |
| 2004/0119561 A1 | 6/2004 | Omote | |
| 2007/0030096 A1 | 2/2007 | Nishihara et al. | |
| 2009/0284328 A1* | 11/2009 | Wiesbauer | H01P 1/213 333/175 |
| 2009/0322444 A1 | 12/2009 | Tanaka | |
| 2010/0109802 A1 | 5/2010 | Tanaka | |
| 2011/0037535 A1 | 2/2011 | Kitamura | |
| 2012/0194298 A1* | 8/2012 | Maurer | H03H 9/0542 333/189 |
| 2013/0321102 A1* | 12/2013 | Iwaki | H03H 1/00 333/193 |

FOREIGN PATENT DOCUMENTS

| | | |
|---|---|---|
| JP | 2007-074698 A | 3/2007 |
| JP | 2010-011300 A | 1/2010 |
| JP | 2010-109694 A | 5/2010 |
| WO | 2009/136472 A1 | 11/2009 |

OTHER PUBLICATIONS

V. Novgorodov et al.; "Modified Ladder-Type 2.4GHz SAW Filter with Transmission Zero"; 2010 IEEE International Ultrasonics Symposium Proceedings, Oct. 11, 2010, pp. 2083-2086.*
Official Communication issued in corresponding European Patent Application No. 13841087.3, mailed on Apr. 28, 2016.
Official Communication issued in International Patent Application No. PCT/JP2013/065834, mailed on Jul. 30, 2013.

* cited by examiner

ELASTIC WAVE FILTER DEVICE AND DUPLEXER COMPRISING MAGNETICALLY COUPLED INDUCTANCES

BACKGROUND OF THE INVENTION

1. Field of the Invention

The present invention relates to an elastic wave filter device in which an elastic wave filter chip is mounted on a package substrate, and more specifically to an elastic wave filter device with a ladder circuit configuration and a duplexer including the elastic wave filter device.

2. Description of the Related Art

In the past, an elastic wave filter device having a ladder circuit configuration has been widely used as a band pass filter. For example, Japanese Unexamined Patent Application Publication No. 2010-109694 listed below discloses an elastic wave filter device used as a transmission filter of a duplexer in a cellular phone. This elastic wave filter device includes a plurality of series arm resonators and a plurality of parallel arm resonators. In Japanese Unexamined Patent Application Publication No. 2010-109694, a bridge inductance is connected in parallel with a part of the series arm resonators. Meanwhile, an inductance for widening the pass band is connected between the parallel arm resonators and a ground potential.

In the elastic wave filter device described in Japanese Unexamined Patent Application Publication No. 2010-109694, the attenuation in a specific frequency range other than the pass band is increased by the bridge inductance. Further, band widening is performed by the inductance connected between the parallel arm resonators and the ground potential.

The above-described bridge inductance and the inductance connected to the parallel arm resonators are formed by the use of coil-shaped conductor patterns. Further, relatively large coil-shaped conductors are required due to a relatively high inductance ratio. Therefore, the inductances are formed not in an elastic wave filter chip but in a package element or material, such as a package substrate, for example. Due to the need to form such relatively large coil conductors, however, there is an problem with an increase in size of a package of the elastic wave filter device.

SUMMARY OF THE INVENTION

Preferred embodiments of the present invention provide an elastic wave filter device which has a ladder circuit configuration including inductances connected to a series arm resonator and a parallel arm resonator, and which has a significantly reduced size, and a duplexer including the elastic wave filter device.

An elastic wave filter device according to a preferred embodiment of the present invention includes a package substrate and an elastic wave filter chip mounted on the package substrate. The elastic wave filter chip defines a ladder circuit including a plurality of series arm resonators and a plurality of parallel arm resonators. Further, in a preferred embodiment of the present invention, the elastic wave filter device further includes a first inductance connected in parallel with at least one of the series arm resonators and a second inductance connected between at least one of the parallel arm resonators and a ground potential. The first inductance and the second inductance are provided in the package substrate. Further, the first inductance is magnetically coupled to the second inductance to shift a frequency position of an attenuation pole in a filter characteristic of the elastic wave filter device.

In a specific aspect of the elastic wave filter device according to various preferred embodiments of the present invention, the first inductance and the second inductance are magnetically coupled to each other to cause the frequency position of the attenuation pole located on the lower frequency side of a pass band to shift toward the lower frequency side.

In another specific aspect of the elastic wave filter device according to various preferred embodiments of the present invention, the first inductance and the second inductance are disposed in the package substrate with no other electrode pattern present therebetween.

In still another specific aspect of the elastic wave filter device according to various preferred embodiments of the present invention, the first inductance and the second inductance are provided in the package substrate so as to be separated from each other in a thickness direction of the package substrate.

In still another specific aspect of the elastic wave filter device according to various preferred embodiments of the present invention, the first inductance and the second inductance at least partially overlap each other in the thickness direction of the package substrate.

In still another specific aspect of the elastic wave filter device according to various preferred embodiments of the present invention, at least one of the first inductance and the second inductance includes a coil conductor portion.

A duplexer according to yet another preferred embodiment of the present invention includes a first filter with a first pass band and a second filter with a second pass band different from the first pass band, in which at least one of the first and second filters includes an elastic wave filter device configured in accordance with one of the other preferred embodiments of the present invention.

The first inductance and the second inductance are provided in the package substrate, and the first inductance is magnetically coupled to the second inductance to shift the frequency position of the attenuation pole. Accordingly, it is possible to significantly reduce the size of the elastic wave filter device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

With reference to the drawings, specific preferred embodiments of the present invention will be described below to describe the present invention.

Figure 1:
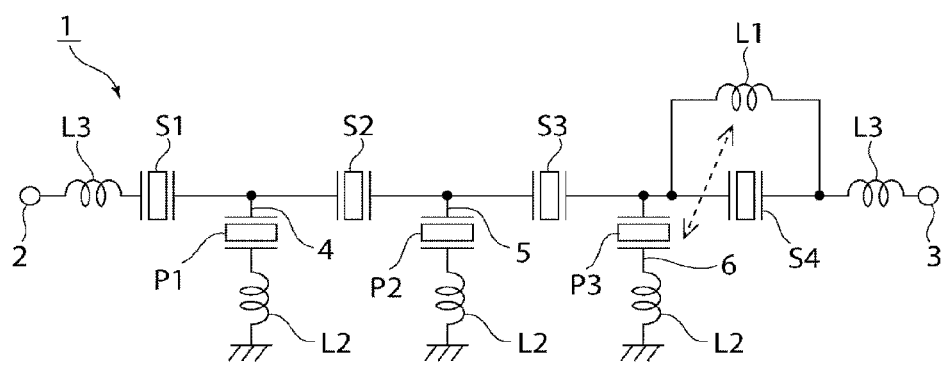
FIG. 1 is a circuit diagram of an elastic wave filter device according to a preferred embodiment of the present invention.

FIG. 1 is a circuit diagram of an elastic wave filter device according to a preferred embodiment of the present invention.

An elastic wave filter device 1 includes an input terminal 2 and an output terminal 3. A line connecting the input terminal 2 and the output terminal 3 corresponds to a series arm. In this series arm, a plurality of series arm resonators S1 to S4 are connected in series with one another.

A first inductance L1 is connected in parallel with the series arm resonator S4 closest to the output terminal 3. The first inductance L1 is a so-called bridge inductance. A bridge inductance increases the attenuation at a specific frequency in an attenuation band of the elastic wave filter device 1. It is possible to adjust the frequency range of this specific frequency band by adjusting the inductance value of the first inductance L1 being a bridge inductance.

An inductance L3 is connected between the input terminal 2 and the series arm resonator S1 and between the series arm resonator S4 and the output terminal 3.

Meanwhile, a plurality of parallel arms 4 to 6 are provided to connect the series arm and a ground potential. The plurality of parallel arms 4 to 6 include parallel arm resonators P1 to P3, respectively. Further, in each of the parallel arms 4, 5, and 6, a second inductance L2 is connected in series with the parallel arm resonator P1, P2, or P3. That is, the second inductance L2 is connected between the ground potential and ground potential-side end portions of the parallel arm resonators P1 to P3. The second inductance L2 adjusts the frequency position of an attenuation pole located on the lower frequency side. More specifically, it is possible to shift the resonant frequency of the parallel arm resonators P1 to P3 toward the lower frequency side by connecting the second inductance L2 to the parallel arm resonators P1 to P3. Accordingly, it is possible to adjust the band width such that the attenuation pole on the lower frequency side of the pass band of the elastic wave filter device 1 with a ladder circuit configuration is shifted toward the lower frequency side.

Figure 2:
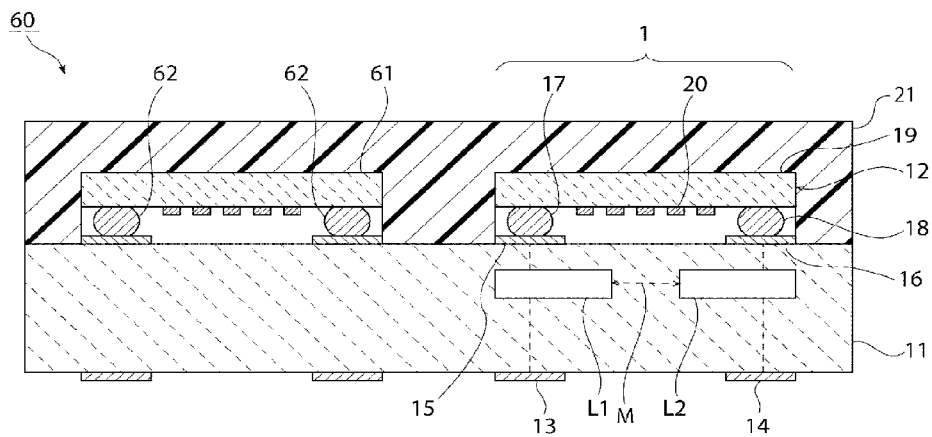
FIG. 2 is a schematic elevational cross-sectional view illustrating the structure of the elastic wave filter device according to a preferred embodiment of the present invention.

FIG. 2 is a schematic elevational cross-sectional view of a duplexer 60 including the elastic wave filter device 1. In the duplexer 60 of the present preferred embodiment, a transmission filter defined by the above-described elastic wave filter device 1 and a reception filter preferably are integrally configured. The pass band of the reception filter is different from the pass band of the transmission filter defined by the elastic wave filter device 1.

In the present preferred embodiment, a package substrate 11 is shared by the transmission filter and the reception filter. An elastic wave filter chip 12 is mounted on a portion of the package substrate 11 in which the elastic wave filter device 1 is provided. The package substrate 11 is made of an appropriate insulating material such as insulating ceramics. The first inductance L1 and the second inductance L2 are provided in the package substrate 11. The first inductance L1 and the second inductance L2 are each defined by a coil-shaped conductor. The first inductance L1 and the second inductance L2, however, may each be defined by a conductor having another shape such as a meandering shape.

In the present preferred embodiment, the first inductance L1 and the second inductance L2 are disposed in the package substrate 11 so as to be separated from each other in a direction parallel or substantially parallel to a direction extending along a substrate main surface, i.e., in the lateral direction, as illustrated in FIG. 2.

As described above, in the present preferred embodiment, the second inductance L2 connected to the parallel arm resonator P3 illustrated in FIG. 1 is magnetically coupled to the first inductance L1. More specifically, the first inductance L1 and the above-described second inductance L2 are magnetically coupled to each other, as indicated by a dashed arrow M in FIG. 2. This magnetic coupling is achievable by arranging the first inductance L1 and the second inductance L2 in proximity to each other to be magnetically coupled to each other. Further, the degree of magnetic coupling is adjustable by the distance therebetween.

Further, the first inductance L1 and the second inductance L2 are disposed with no other conductive pattern interposed therebetween. It is therefore possible to easily adjust the degree of magnetic coupling between the first and second inductances L1 and L2.

The lower surface of the package substrate 11 is provided with outer terminals 13 and 14. The outer terminals 13 and 14 are configured to electrically connect the above-described elastic wave filter device 1 to the outside.

Meanwhile, the upper surface of the package substrate 11 is provided with electrode lands 15 and 16. Although FIG. 2 only illustrates the electrode lands 15 and 16, a plurality of other electrode lands are provided on the package substrate 11.

The elastic wave filter chip 12 is bonded to the electrode lands 15 and 16 preferably by the flip-chip bonding method. That is, the elastic wave filter chip 12 is bonded to the electrode lands 15 and 16 by bumps 17 and 18, respectively. The elastic wave filter chip 12 includes a piezoelectric substrate 19 and electrodes 20 provided on the lower surface of the piezoelectric substrate 19. The electrodes 20 include the series arm resonators S1 to S4 and the parallel arm resonators P1 to P3 described above and wiring portions to connect these elements. Meanwhile, the first inductance L1 and the second inductance L2 illustrated in FIG. 1 are provided in the package substrate 11, as described above. Therefore, an increase in size of the elastic wave filter chip 12 is not caused.

Moreover, in the present preferred embodiment, the above-described first inductance L1 and the second inductance L2 connected to the parallel arm resonator P3 illustrated in FIG. 1 are magnetically coupled to each other in the package substrate 11. Thus, it is also possible to significantly reduce the size of the package substrate 11.

In a left portion of FIG. 2, an elastic wave filter chip 61 defining the reception filter is mounted by bumps 62 in accordance with the flip-chip bonding method. This reception filter is defined by a longitudinally coupled resonator-type surface acoustic wave filter. The pass band of the reception filter is located on the lower frequency side of the pass band of the elastic wave filter device 1 defining the transmission filter. The first inductance L1, i.e., a bridge inductance, is provided to increase the attenuation in the pass band of this reception filter. More specifically, an attenuation pole is provided in the pass band of the reception filter by the connection of the first inductance L1. The position of this attenuation pole is adjustable by the value of the first inductance L1 and/or the degree of magnetic coupling described later.

As described above, the elastic wave filter device 1 of the present preferred embodiment is preferably usable for the purpose of providing a band pass filter of a duplexer. Further, an outer resin layer 21 is provided to cover the elastic wave filter chip 12.

Figure 3:
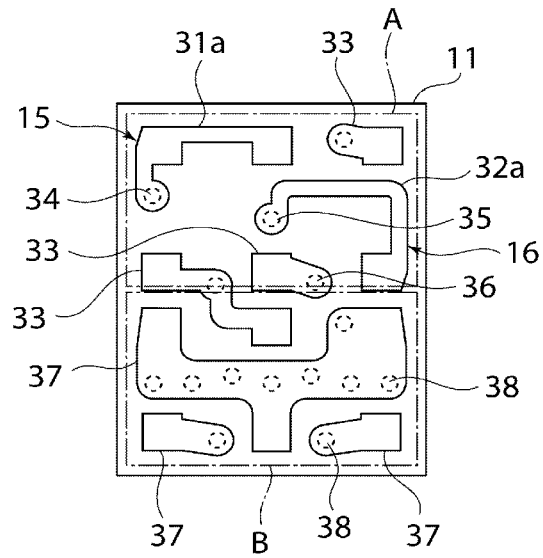
FIG. 3 is a schematic plan view illustrating an electrode structure on an upper surface of a package substrate used in a duplexer according to a preferred embodiment of the present invention.
Figure 4:
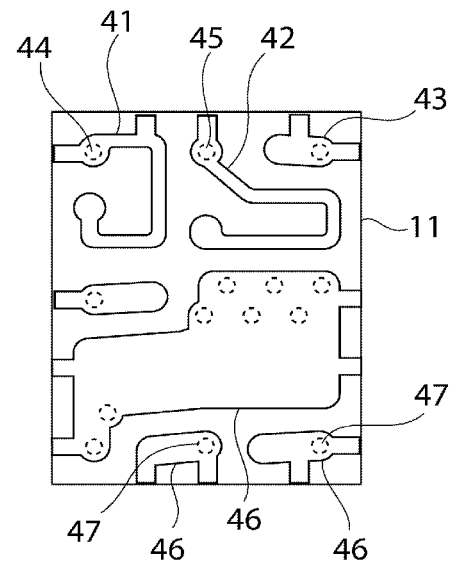
FIG. 4 is a schematic plan view illustrating an electrode structure on an intermediate layer of the package substrate used in the duplexer according to a preferred embodiment of the present invention.
Figure 5:
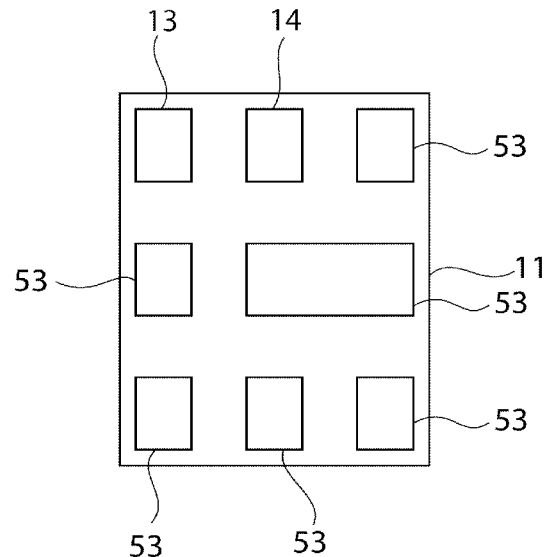
FIG. 5 is a schematic plan view illustrating an electrode structure on a lower surface of the package substrate used in the duplexer according to a preferred embodiment of the present invention.

FIG. 3 is a plan view illustrating an electrode structure on the upper surface of the above-described package substrate 11. FIG. 4 is a plan view illustrating an electrode structure on an intermediate layer of the package substrate 11. FIG. 5 is a plan view illustrating an electrode structure on the lower surface of the package substrate 11.

The above-described elastic wave filter chip 12 is mounted in an area indicated by a dash-dotted line A in FIG. 3. Further, the elastic wave filter chip 61 defining the above-described reception filter is mounted in an area surrounded by a dash-dotted line B. The present preferred embodiment is characteristic in the elastic wave filter device 1 including the elastic wave filter chip 12 defining the above-described transmission filter. Therefore, the following description will focus on the electrode structures located in the area indicated by the dash-dotted line A in FIG. 3 and areas therebelow.

In the area indicated by the dash-dotted line A, a plurality of electrode lands 15, 16, and 33 are provided on the upper surface of the package substrate 11. The plurality of electrode lands 15, 16, and 33 are electrically connected to via hole electrodes 34, 35, and 36 extending downward from the upper surface of the package substrate 11. Herein, the electrode lands 15 and 16 include coil-shaped conductor portions 31a and 32a, respectively. Each of the coil-shaped conductor portions 31a and 32a preferably has a planer shape defining a portion of a coil-shaped conductor. More specifically, an end portion of the coil-shaped conductor portion 31a is electrically connected to the via hole electrode 34 extending downward. Similarly, an end portion of the coil-shaped conductor portion 32a is electrically connected to the via hole electrode 35 extending downward. The remaining electrode lands 33 are electrically connected to the via hole electrodes 36 extending downward.

As illustrated in FIG. 4, the intermediate layer includes a coil-shaped conductor portion 41 connected to the lower end of the above-described via hole electrode 34. The coil-shaped conductor portion 41 and the coil-shaped conductor portion 31a are electrically connected by the via hole electrode 34. Thus, the first inductance L1 is provided.

Similarly, a coil-shaped conductor portion 42 is disposed below the coil-shaped conductor portion 32a. The coil-shaped conductor portion 42 is electrically connected to the coil-shaped conductor portion 32a by the via hole electrode 35. The second inductance L2 is provided by the coil-shaped conductor portion 32a and the coil-shaped conductor portion 42.

As described above, in the present preferred embodiment, the first inductance L1 and the second inductance L2 are disposed in the package substrate 11 so as to be separated from each other in the lateral direction but in proximity to each other to be magnetically coupled to each other.

The degree of this magnetic coupling is achievable by the adjustment of the distance between the first inductance L1 and the second inductance L2, as described above.

The coil-shaped conductor portions 41 and 42 illustrated in FIG. 4 are electrically connected to via hole electrodes 44 and 45, respectively. The via hole electrode 44 is electrically connected to the outer terminal 13 illustrated in FIG. 5, which defines and serves as a transmission terminal. Further, the via hole electrode 45 is electrically connected to the outer terminal 14 illustrated in FIG. 5, which defines and serves as a ground terminal.

The remaining electrode lands 33 and 37, via hole electrodes 36 and 38, electrode layers 46, and via hole electrodes 47 illustrated in FIGS. 3 and 4 are provided to electrically connect the transmission filter and the reception filter described above to one of remaining outer terminals 53 illustrated in FIG. 5.

In the elastic wave filter device 1 of the present preferred embodiment, the first inductance L1 and the second inductance L2 are magnetically coupled to each other in the package substrate 11, as described above. It is therefore possible to reduce the size of the package substrate 11 and thus the size of the elastic wave filter device 1. This will be described with reference to FIGS. 6 and 7.

Figure 6:
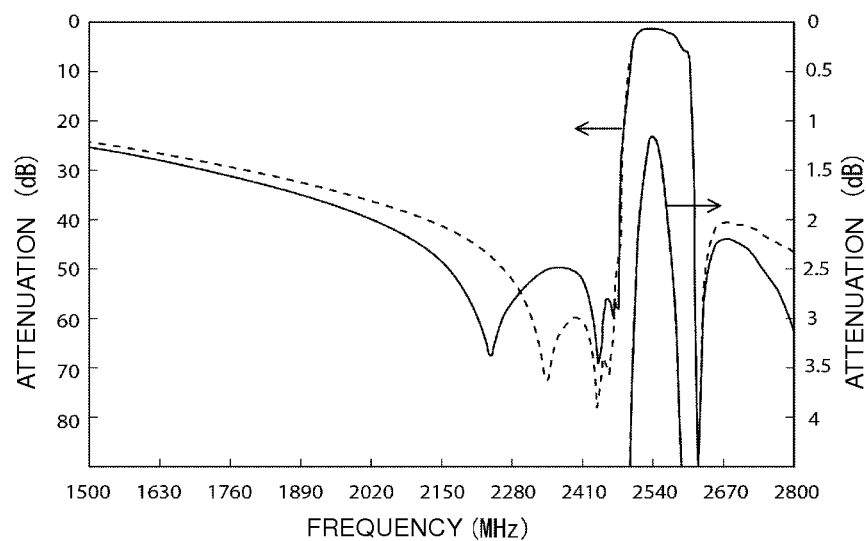
FIG. 6 is a diagram illustrating attenuation-frequency characteristics of a comparative example and a preferred embodiment having the same bridge inductance value as that of the comparative example.

In FIG. 6, a solid line indicates an attenuation-frequency characteristic of the elastic wave filter device 1 of the above-described preferred embodiment, and a dashed line indicates an attenuation-frequency characteristic of an elastic wave filter device of a comparative example. The inductance value of the first inductance L1 preferably is about 6 nH, for example. The inductance value of the second inductance L2 preferably is about 0.7 nH, for example. In this comparative example, the first inductance L1 and the second inductance L2 are not magnetically coupled to each other. The comparative example is otherwise similar to the above-described preferred embodiment. According to the present preferred embodiment, the first inductance L1 and the second inductance L2 are magnetically coupled to each other. Therefore, the frequency of the attenuation pole located on the lower frequency side of the pass band is approximately 2200 MHz in the present preferred embodiment, while the frequency of the attenuation pole is approximately 2300 MHz in the comparative example. That is, it is understood from the attenuation-frequency characteristics of FIG. 6 that the attenuation pole is shifted toward the lower frequency side in the present preferred embodiment.

Figure 7:
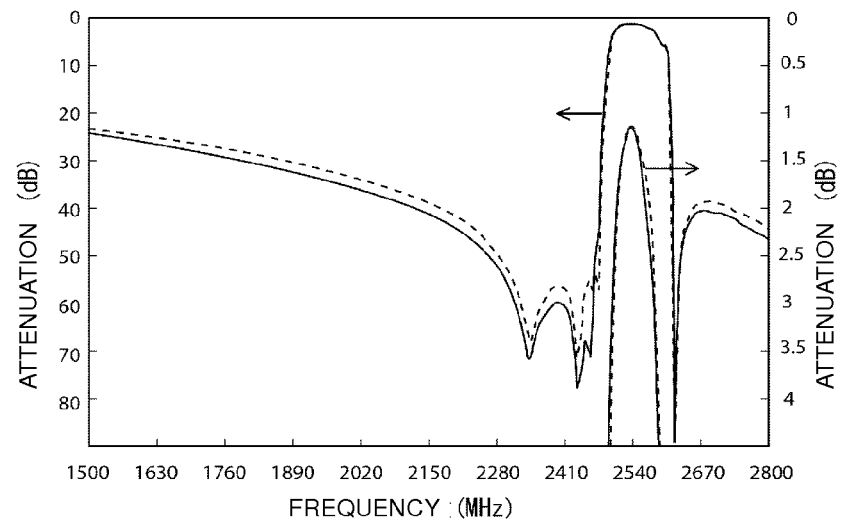
FIG. 7 is a diagram illustrating attenuation-frequency characteristics of a comparative example and a preferred embodiment of the present invention with an attenuation pole that is the same or substantially the same in frequency position as that of the comparative example.

In FIG. 7, a solid line indicates an attenuation-frequency characteristic of an elastic wave filter device of a preferred embodiment in which the value of the first inductance L1 is about 4.7 nH, for example. A dashed line indicates an attenuation-frequency characteristic of a comparative example in which the inductance value of the first inductance L1 is about 6.0 nH, for example, and the first inductance L1 and the second inductance L2 are not magnetically coupled to each other.

As is clear from FIG. 7, it is understood that, if the inductance value of the first inductance L1 is reduced, there is no shift in frequency of the attenuation pole located on the lower frequency side of the pass band in the present preferred embodiment and the comparative example.

As is clear from FIG. 6, it is understood that, if the magnitude of the bridge inductance is the same, the present preferred embodiment is capable of causing the attenuation pole on the lower frequency side of the pass band by the bridge inductance to shift to a lower frequency position, as compared with the comparative example. That is, it is understood that the first and second inductances L1 and L2 are magnetically coupled to each other by the application of the configuration of the present preferred embodiment, thus making it possible to cause the band in which the attenuation is desired to be increased to shift toward the lower frequency side.

Further, as is clear from FIG. 7, with the application of the configuration of the present preferred embodiment, it is possible to make the attenuation pole on the lower frequency side of the pass band by the bridge inductance equal in frequency to that of the comparative example, even if the value of the first inductance L1 is reduced. It is therefore possible to maintain the attenuation characteristic of the filter even with the use of the first inductance L1 small in size and inductance value. Accordingly, it is understood that it is possible to effectively reduce the size of the package substrate 11 and thus the size of the elastic wave filter device 1.

Figure 8:
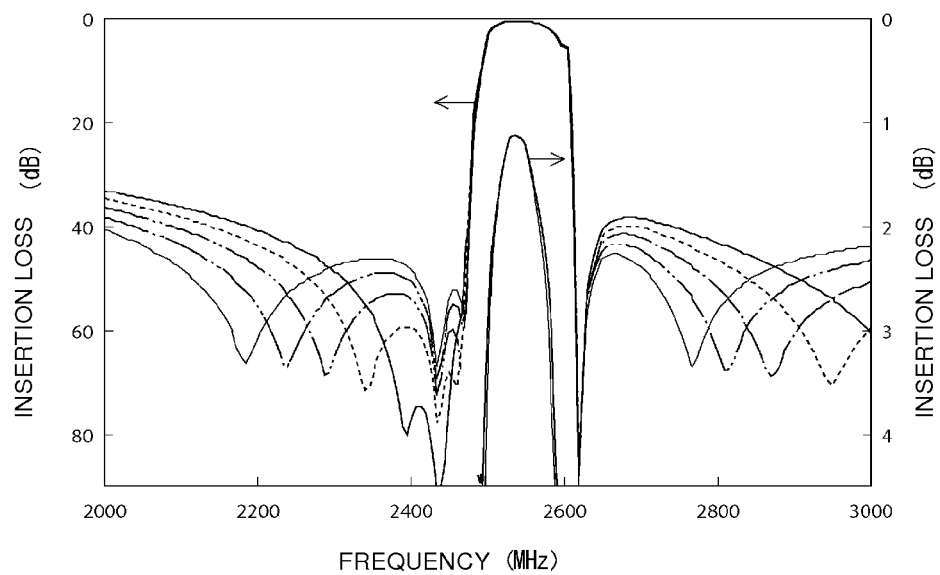
FIG. 8 is a diagram illustrating attenuation-frequency characteristics of a preferred embodiment of the present invention in FIG. 6 obtained by changing a coupling coefficient K of magnetic coupling between first and second inductances.

FIG. 8 illustrates attenuation-frequency characteristics of the elastic wave filter device 1 of the preferred embodiment illustrated in FIG. 6, in which the value of the first inductance L1 and the value of the second inductance L2 are, for example, about 6 nH and about 0.7 nH, respectively. The drawing illustrates the attenuation-frequency characteristics obtained by changing the value of a coupling coefficient K between the first inductance L1 and the second inductance L2 to approximately −0.1, 0, 0.1, 0.2, and 0.3, for example. According to FIG. 8, the position of the attenuation pole located on the lower frequency side of the pass band of the elastic wave filter device 1 shifts toward the lower frequency side if the K value is increased to be a positive value, and the position of the attenuation pole shifts toward the higher frequency side if the K value becomes a negative value, as compared with a case in which the K value is 0, i.e., there is no magnetic coupling. It is therefore understood that it is possible in the present preferred embodiment of the present invention to change the position of the frequency of the attenuation pole toward the lower frequency side of the pass band of the elastic wave filter device 1 by changing the value of the coupling coefficient K, i.e., by changing the degree of magnetic coupling, without an increase in inductance value of the first inductance L1 and the second inductance L2.

Figure 9:
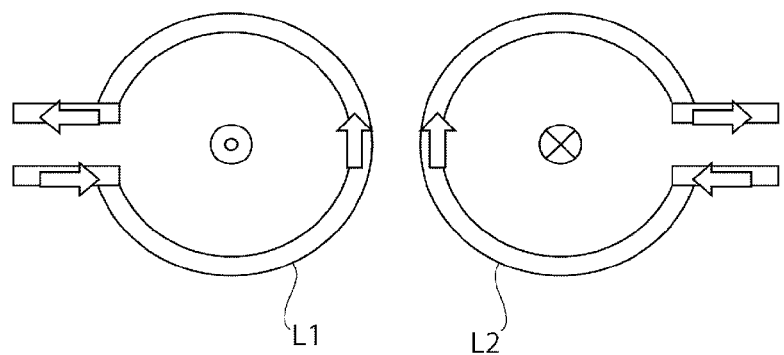
FIG. 9 is a schematic diagram illustrating magnetic coupling between the first and second inductances not overlapping each other in a plan view.

In the above-described preferred embodiment, the first inductance L1 and the second inductance L2 are separated from each other in the package substrate 11 in the direction parallel to the main surface of the package substrate 11. If the disposed first inductance L1 and second inductance L2 do not overlap each other in the direction of a plan view of the package substrate 11 and are separated from each other in the direction parallel to the plane, as illustrated in FIG. 9, the coupling coefficient K has a positive value when the first inductance L1 and the second inductance L2 are magnetically coupled to each other such that a downward magnetic flux relative to the drawing plane generated from the first inductance L1 and an upward magnetic flux relative to the drawing plane generated from the second inductance L2 are oriented in opposite directions to each other. The coupling coefficient K has a negative value when the first inductance L1 and the second inductance L2 are magnetically coupled to each other such that the respective magnetic fluxes are oriented in the same direction.

Figure 10:
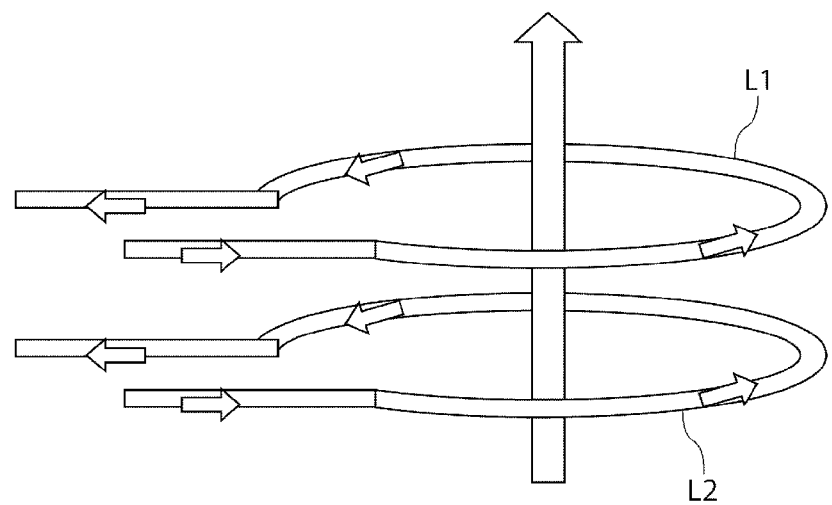
FIG. 10 is a schematic diagram illustrating magnetic coupling between the first and second inductances overlapping each other in a plan view.

As illustrated in FIG. 10, a coil conductor providing the first inductance L1 and a coil conductor providing the second inductance L2 preferably are separated from each other in the package substrate 11 in the thickness direction of the package substrate 11. In this case, it is desirable to dispose the first inductance L1 and the second inductance L2 to partially overlap each other in a plan view of the package substrate 11, as illustrated in FIG. 10. With this configuration, it is also possible to increase the degree of magnetic coupling by reducing the area in which the first inductance L1 and the second inductance L2 do not overlap each other. In the configuration of FIG. 10, the coupling coefficient K has a positive value when the first inductance L1 and the second inductance L2 are magnetically coupled to each other such that the respective magnetic fluxes generated from the first inductance L1 and the second inductance L2 are oriented in the same direction in a portion in which the first inductance L1 and the second inductance L2 overlap each other in a plan view. The coupling coefficient K has a negative value when the first inductance L1 and the second inductance L2 are magnetically coupled to each other such that the magnetic fluxes are oriented in opposite directions to each other.

Figure 11:
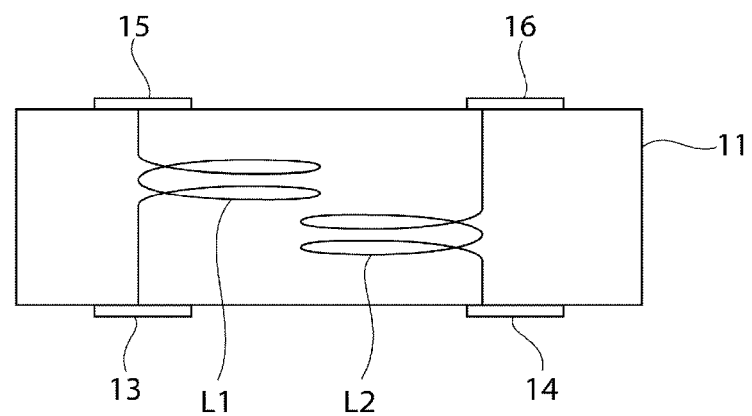
FIG. 11 is a schematic elevational cross-sectional view illustrating a package substrate used in another preferred embodiment of the present invention.

It is also possible to adjust the degree of magnetic coupling by changing the degree of overlapping of the inductances in a plan view or by changing the distance between the first inductance L1 and the second inductance L2 in the thickness direction of the package substrate 11, as in a modified example of a preferred embodiment of the present invention illustrated in FIG. 11. If a wiring pattern, which is a conductor provided in the package substrate 11 and other than a coil conductor defining at least a portion of the first inductance L1 and the second inductance L2, is disposed between the first inductance L1 and the second inductance L2 in the direction of the plan view of the package substrate 11, the degree of magnetic coupling of the inductances is reduced by the influence of the wiring pattern. To increase the degree of magnetic coupling, therefore, it is preferable to provide a configuration in which no wiring pattern is disposed between the first inductance L1 and the second inductance L2 in the direction of the plan view of the package substrate 11.

In the above-described preferred embodiment, the first inductance L1 and the second inductance L2 electrically connected to the parallel arm resonator P3 closest to the output terminal 3 are magnetically coupled to each other. However, the first inductance L1 may be magnetically coupled to the second inductance L2 connected to the parallel arm resonator P1 or P2 other than the parallel arm resonator P3. Further, the connection position of the first inductance L1 being a bridge inductance is not limited to the series arm resonator S4, and may be connected in parallel with one of the series arm resonators S1 to S3.

Further, the first inductance L1 may include a plurality of inductances. In this case, it suffices if at least one of the first inductances L1 is magnetically coupled to at least one second inductance L2.

Further, the series arm resonators S1 to S4 and the parallel arm resonators P1 to P3 defined by surface acoustic wave resonators in the above-described preferred embodiment may be provided by boundary acoustic wave resonators or bulk acoustic wave (BAW) resonators.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter device comprising:
   a package substrate;
   an elastic wave filter chip mounted on the package substrate, the elastic wave filter chip defining a ladder circuit including a plurality of series arm resonators and a plurality of parallel arm resonators;
   a first inductance connected in parallel with at least one of the series arm resonators; and
   a second inductance connected between at least one of the parallel arm resonators and a ground potential; wherein
   the first inductance and the second inductance are provided in the package substrate, and the first inductance is magnetically coupled to the second inductance to shift a frequency position of an attenuation pole relative to an attenuation pole in a case where there is no magnetic coupling between the first inductance and the second inductance.

2. The elastic wave filter device described in claim 1, wherein the first inductance and the second inductance are magnetically coupled to each other to cause the frequency position of the attenuation pole located on a lower frequency side of a pass band of the ladder circuit to shift toward a lower frequency position on the lower frequency side of the pass band.

3. The elastic wave filter device described in claim 1, wherein the first inductance and the second inductance are disposed in the package substrate with no other electrode pattern present therebetween.

4. The elastic wave filter device described in claim 1, wherein the first inductance and the second inductance are provided in the package substrate so as to be separated from each other in a thickness direction of the package substrate.

5. The elastic wave filter device described in claim 4, wherein the first inductance and the second inductance at least partially overlap each other in a thickness direction of the package substrate.

6. The elastic wave filter device described in claim 1, wherein at least one of the first inductance and the second inductance includes a coil conductor portion.

7. The elastic wave filter device described in claim 1, wherein the elastic wave filter chip includes a piezoelectric substrate and electrodes on the piezoelectric substrate to define the plurality of series arm resonators and the plurality of parallel arm resonators.

8. The elastic wave filter device described in claim 1, further comprising bumps configured to mount and connect the elastic wave filter chip on and to the package substrate.

9. The elastic wave filter device described in claim 1, further comprising another elastic wave filter chip including a longitudinally coupled resonator-type surface acoustic wave filter defining a reception filter.

10. The elastic wave filter device described in claim 1, wherein the series arm resonators and the parallel arm resonators include at least one of surface acoustic wave resonators, boundary acoustic wave resonators, and bulk acoustic wave resonators.

11. A duplexer comprising:
    a first filter including a first pass band and a second filter defining a second pass band different from the first pass band; wherein
    at least one of the first and second filters includes:
       a package substrate;
       an elastic wave filter chip mounted on the package substrate, the elastic wave filter chip defining a ladder circuit including a plurality of series arm resonators and a plurality of parallel arm resonators;
       a first inductance connected in parallel with at least one of the series arm resonators; and
       a second inductance connected between at least one of the parallel arm resonators and a ground potential; wherein
       the first inductance and the second inductance are provided in the package substrate, and the first inductance is magnetically coupled to the second inductance to shift a frequency position of an attenuation pole relative to an attenuation pole in a case where there is no magnetic coupling between the first inductance and the second inductance.

12. The duplexer described in claim 11, wherein the first inductance and the second inductance are magnetically coupled to each other to cause the frequency position of the attenuation pole located on the lower frequency side of a pass band to shift toward the lower frequency side.

13. The duplexer described in claim 11, wherein the first inductance and the second inductance are disposed in the package substrate with no other electrode pattern present therebetween.

14. The duplexer described in claim 11, wherein the first inductance and the second inductance are provided in the package substrate so as to be separated from each other in a thickness direction of the package substrate.

15. The duplexer described in claim 14, wherein the first inductance and the second inductance at least partially overlap each other in a thickness direction of the package substrate.

16. The duplexer described in claim 11, wherein at least one of the first inductance and the second inductance includes a coil conductor portion.

17. The duplexer described in claim 11, wherein the elastic wave filter chip includes a piezoelectric substrate and electrodes on the piezoelectric substrate to define the plurality of series arm resonators and the plurality of parallel arm resonators.

18. The duplexer described in claim 11, further comprising bumps configured to mount and connect the elastic wave filter chip on and to the package substrate.

* * * * *